(12) United States Patent
Hamby et al.

(10) Patent No.: US 10,132,453 B2
(45) Date of Patent: Nov. 20, 2018

(54) FLEXIBLE LIGHT ENGINE WITH BUS BARS AND INTERCONNECTORS

(71) Applicants: David Hamby, Andover, MA (US); Richard Speer, Concord, MA (US)

(72) Inventors: David Hamby, Andover, MA (US); Richard Speer, Concord, MA (US)

(73) Assignee: ORSAM SYLVANIA Inc., Wilmington, MA (US)

( * ) Notice: Subject to any disclaimer, the term of this patent is extended or adjusted under 35 U.S.C. 154(b) by 0 days.

(21) Appl. No.: 15/244,881

(22) Filed: Aug. 23, 2016

(65) Prior Publication Data

US 2018/0058649 A1 Mar. 1, 2018

(51) Int. Cl.
*F21S 4/22* (2016.01)
*F21V 29/70* (2015.01)
(Continued)

(52) U.S. Cl.
CPC .................. *F21S 4/22* (2016.01); *F21K 9/90* (2013.01); *F21S 4/24* (2016.01); *F21V 17/101* (2013.01);
(Continued)

(58) Field of Classification Search
CPC ........ F21V 29/70; F21V 17/101; F21V 23/06; F21V 19/003; F21Y 2103/10; F21Y 2115/10; F21S 4/22; F21K 9/90
See application file for complete search history.

(56) References Cited

U.S. PATENT DOCUMENTS 5,151,386 A 9/1992 Bottari et al.
5,178,685 A 1/1993 Borenstein et al.
(Continued)

FOREIGN PATENT DOCUMENTS

CN 203656682 U 6/2014
CN 203880482 U 10/2014
(Continued)

OTHER PUBLICATIONS

Machine translation, including concise explanation in Abstract (p. 1), of CN 203656682, provided with EPO Search Report in counterpart EP appln. 17179460 (dated Jan. 19, 2018), 7 pgs.
(Continued)

*Primary Examiner* — Kevin Quarterman
(74) *Attorney, Agent, or Firm* — Edward S. Podszus

(57) ABSTRACT

A flexible light engine, comprising insulating lower and upper laminate sheets; first and second electrically conductive metallic bus bars between the sheets; a plurality of electrically conductive metallic conductors between the sheets being disposed laterally between the bus bars, wherein each conductor defines two metallic contacts exposed in register with adjacent perforations in the perforated upper sheet; wherein each of the bus bars further comprises respective at least two interconnectors, and wherein the conductors are connected to respective interconnectors to define at least two series circuits and connectable in parallel between the bus bars, wherein each of the series circuits comprises a subset of the plurality of metallic conductors; and a plurality of LEDs attached to the contacts defining at least two series LED strings and connected in parallel between the bus bars, each said LED string comprising a plurality of LEDs.

25 Claims, 5 Drawing Sheets

(51) Int. Cl.
*F21K 9/90* (2016.01)
*F21V 17/10* (2006.01)
*F21V 19/00* (2006.01)
*F21V 23/06* (2006.01)
*H05K 1/18* (2006.01)
*H05K 3/20* (2006.01)
*F21S 4/24* (2016.01)
*F21Y 103/10* (2016.01)
*F21Y 115/10* (2016.01)
*H05K 1/02* (2006.01)

(52) U.S. Cl.
CPC ............ *F21V 19/003* (2013.01); *F21V 23/06* (2013.01); *F21V 29/70* (2015.01); *H05K 1/189* (2013.01); *H05K 3/202* (2013.01); *F21Y 2103/10* (2016.08); *F21Y 2115/10* (2016.08); *H05K 1/0209* (2013.01); *H05K 2201/10106* (2013.01); *H05K 2203/063* (2013.01); *H05K 2203/1545* (2013.01); *H05K 2203/175* (2013.01)

(56) References Cited

U.S. PATENT DOCUMENTS

| | | | |
|---|---|---|---|
| 8,314,566 | B2 | 11/2012 | Steele et al. |
| 9,089,018 | B2 | 7/2015 | Tischler et al. |
| 2008/0191220 | A1 | 8/2008 | Daniels et al. |
| 2008/0295327 | A1 | 12/2008 | Aeling et al. |
| 2012/0068622 | A1 | 3/2012 | Ward |
| 2012/0241806 | A1 | 9/2012 | Kim et al. |
| 2012/0320581 | A1* | 12/2012 | Rogers ............ H01L 24/24 362/235 |
| 2013/0122639 | A1 | 5/2013 | Degroot et al. |
| 2014/0062316 | A1* | 3/2014 | Tischler ............ H05B 33/0821 315/185 R |
| 2014/0225132 | A1 | 8/2014 | Livesay et al. |
| 2014/0268780 | A1* | 9/2014 | Wang ............ F21V 19/003 362/249.06 |
| 2014/0369038 | A1 | 12/2014 | Tischler et al. |
| 2015/0003083 | A1* | 1/2015 | Uehara ............ F21S 48/212 362/418 |
| 2015/0092413 | A1 | 4/2015 | Li et al. |
| 2015/0092429 | A1 | 4/2015 | Speer et al. |
| 2015/0129899 | A1 | 5/2015 | Speer |
| 2015/0129909 | A1 | 5/2015 | Speer et al. |

FOREIGN PATENT DOCUMENTS

| | | |
|---|---|---|
| DE | 10 2010 049 333 A1 | 4/2012 |
| EP | 0 677 695 A2 | 10/1995 |
| EP | 1 473 978 A1 | 3/2004 |

OTHER PUBLICATIONS

Machine translation, including concise explanation in Abstract (p. 1), of CN 203880482, provided with EPO Search Report in counterpart EP appln. 17179460 (dated Jan. 19, 2018), 13 pgs.

Technical spec sheet "Zero Ohm Jumper (0.0002 Max.), Solid Copper Strip, Surface Mount Resistor", Document No. 30192 pub. Vishay Intertechnology, Inc. (rev. Oct. 2, 2012) (3 pp.).

Product data sheet for Spraylat silver ink TypeXCSD-006, Spraylat Corp. (NY) (rev. Oct. 30, 2008) (3pp., color).

Product data sheet "118-09C Solvent-Resistant Electrically Conductive Ink", pub. Creative Materials, Inc. (MA) (1 p.).

Obene et al., "High resolution copper ink printing for electronic interconnects", pp. 20, 22 in Electric Engineering Times Europe, Sep. 2013 (2 pp.).

Abstract in English of EP 0 677 695 obtained from Espacenet website (1 pg.).

Abstract in English of DE 10 2010 049 333 obtained from Espacenet website (1 pg.).

* cited by examiner

FLEXIBLE LIGHT ENGINE WITH BUS BARS AND INTERCONNECTORS

CROSS REFERENCE TO RELATED APPLICATIONS

N/A

TECHNICAL FIELD

The present disclosure relates to a flexible light engine with LED circuits laminated on flexible polymeric substrate, particularly for use in general lighting applications.

BACKGROUND AND ACKNOWLEDGED PRIOR ART

The following flexible substrate strip LED light engines of Applicant's assignee are known, and are each incorporated hereby in their entirety as if fully set forth herein: Pat. Pub. US 2015/0129909 (Speer et al.) and US 2015/0092413 (Li et al.).

Known is also Pat. Pub. US 2012/0241806 (Kim), showing at the embodiment described at FIG. 9 therein a base layer formed of FR4, a bonded copper foil layer, and the outer insulating layer. The Kim '806 circuit is understood to be formed by conventional lithographic process. Such a process uses a copper foil held by glue to an FR4 material to form the copper clad substrate (i.e., the insulating film layer is not required to hold the copper foil layer in place), which is then etched in a bath to remove copper from where traces are not needed, thus requiring an expensive mask to be made, to require batch processing, and to require the use of inconvenient etch materials.

The following are also known in U.S. Pat. No. 8,314,566 (Steele); U.S. Pat. No. 5,178,685 (Borenstein); U.S. Pat. No. 5,151,386 (Bottari); Pat. Pubs. 2008/0295327 (Aeling); US 2015/0092429 (Speer); 2015/0129899 (Speer); 2008/0191220 (Daniels).

SUMMARY

In at least one embodiment of the present disclosure a method of roll-to-roll manufacturing a circuit for a flexible light engine is provided, with the method comprising: providing an electrically insulating, flexible lower laminate sheet 12 from a first roll; providing an electrically insulating, flexible upper laminate sheet 14 from a second roll; forming electrically conductive first and second metallic bus bars 20, 22 in a single conductive layer on at least one of the lower and upper laminate sheets 12, 14; forming electrically conductive interconnectors 30 at a plurality of locations on each of the first and second metallic bus bars 20, 22; providing a metallic strip 40 from a third roll; disposing the metallic strip 40 in the single conductive layer on at least one of the lower and upper laminate sheets 12, 14; connecting the metallic strip 40 via the interconnectors 30 to the first metallic bus bar 20 at the plurality of interconnector locations of the first metallic bus bar 20; connecting the metallic strip 40 via the interconnectors 30 to the second metallic bus bar 22 at the plurality of electrical interconnector locations of the second metallic bus bar 22; retaining the metallic strip 40 between the lower laminate sheet 12 and the upper laminate sheet 14 by laminating the lower laminate sheet 12 with the upper laminate sheet 14, whereby the laminating also disposes the first and second metallic bus bars 20, 22 between the lower laminate sheet 12 and the upper laminate sheet 14; perforating the upper laminate sheet 14, wherein perforations 16 of the upper laminate sheet 14 are in register with exposed portions 42 of the metallic strip 40; perforating the exposed portions 42 of the metallic strip 40 thereby defining a plurality of metallic contacts 50; coupling an LED package 60 within each perforation 16 of the upper laminate sheet 14 to the metallic contacts 50 provided by the exposed portions 42 of the metallic strip 40, thereby defining a plurality of series LED strings 64 connected in parallel between the first and second metallic bus bars 20, 22; and coiling the flexible light engine 10 onto a fourth roll.

In at least one embodiment, the method may further comprise perforating the exposed portions 42 of the metallic strip 40 defines a plurality of metallic conductors 48 each having two respective of the metallic contacts 50, each metallic conductor 48 extending between adjacent perforations 16 of the upper laminate sheet 14.

In at least one embodiment, the method may further comprise aligning the lower and upper laminate sheets 12, 14 in a major longitudinal direction L; wherein the first and second metallic bus bars 20, 22 are formed extending in the major longitudinal direction L; and wherein the metallic strip 40 is disposed extending in the major longitudinal direction L.

In at least one embodiment of the present disclosure a flexible light engine 10 may be provided, comprising: an electrically insulating, flexible lower laminate sheet 12; an electrically insulating, perforated, flexible upper laminate sheet 14; a first metallic bus bar 20 and a second metallic bus bar 22 disposed in a single conductive layer between the lower laminate sheet 12 and the upper laminate sheet 14, the first metallic bus bar 20 and the second metallic bus bar 22 being electrically conductive; a plurality of electrically conductive metallic conductors 48 being disposed in the single conductive layer between the lower laminate sheet 12 and the upper laminate sheet 14 and being disposed laterally, in a width direction W, between the first metallic bus bar 20 and the second metallic bus bar 22; wherein each metallic conductor 48 defines two metallic contacts 50, the two metallic contacts 50 of each metallic conductor 48 being exposed in register with adjacent perforations 16 in the perforated upper laminate sheet 14; wherein each of the first and second metallic bus bars 20, 22 further comprises respective at least two interconnectors 30, and wherein the metallic conductors 48 are connected to respective interconnectors 30 to define at least two series circuits 70 and connectable in parallel between the first and second metallic bus bars 20, 22, wherein each of the at least two series circuits 70 comprises a subset of the plurality of metallic conductors 48; and a plurality of surface mount light emitting diodes (LEDs) 60 attached to the metallic contacts 48 defining at least two series LED strings 64 and connected in parallel between the first and second metallic bus bars 20, 22, each said LED string 64 comprising a plurality of LEDs 60.

BRIEF DESCRIPTION OF FIGURES

The above-mentioned and other features of this disclosure, and the manner of attaining them, will become more apparent and better understood by reference to the following description of embodiments described herein taken in conjunction with the accompanying drawings, wherein.

DETAILED DESCRIPTION INCLUDING BEST MODE OF A PREFERRED EMBODIMENT

Figure 1:
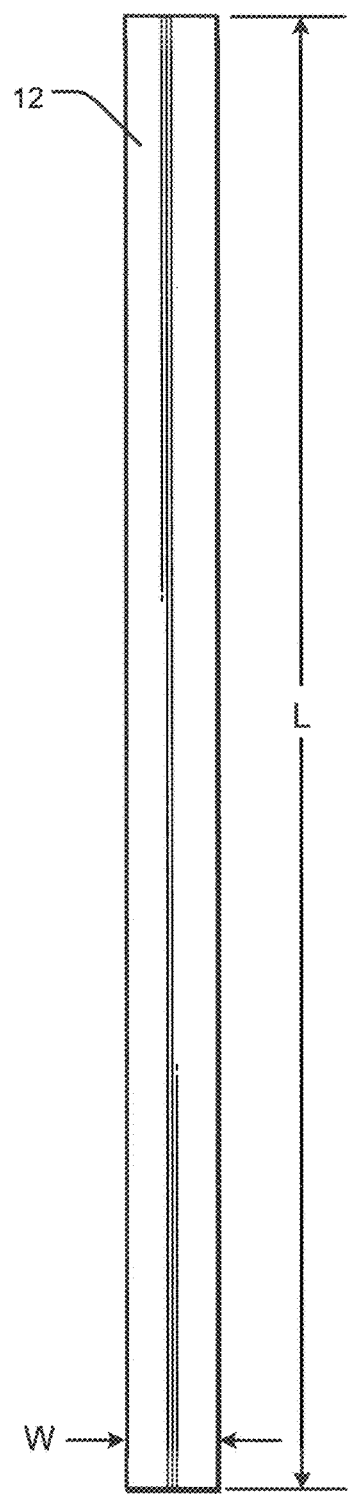
FIG. 1 is a plan view of a lower laminate sheet for a flexible light engine according to the present disclosure.

It may be appreciated that the present disclosure is not limited in its application to the details of construction and the arrangement of components set forth in the following description or illustrated in the drawings. The embodiments herein may be capable of being practiced or being carried out in various ways. Also, it may be appreciated that the phraseology and terminology used herein is for the purpose of description and should not be regarded as limiting as such may be understood by one of skill in the art.

Figure 7:
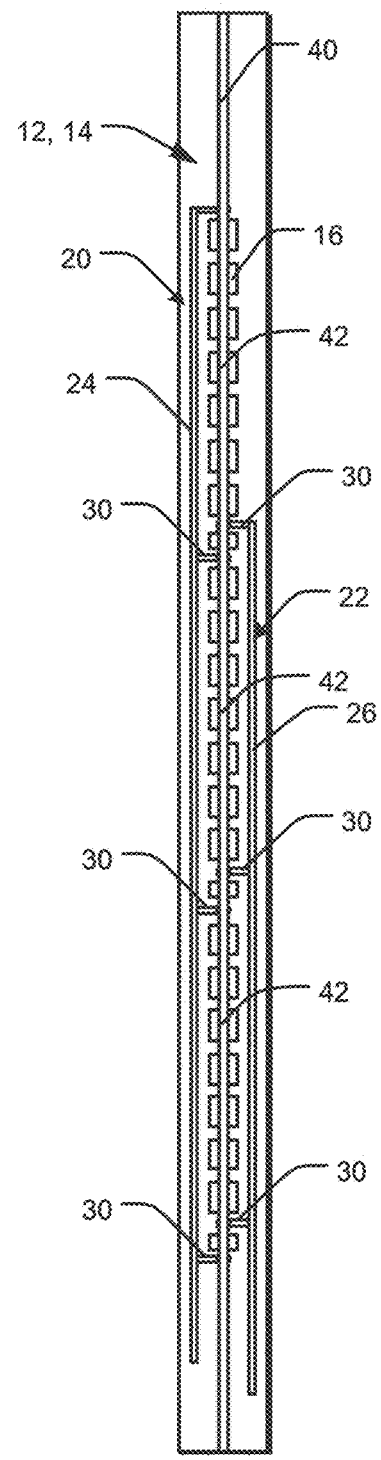
FIG. 7 is a plan view of the lower and upper laminate sheets after the upper laminate sheet has been disposed over and laminated with the lower laminate sheet, with the first and second bus bars, the interconnectors, the electrically conductive flowable joining composition and the elongated metallic conductor disposed between the lower and upper laminate sheets.
Figure 8:
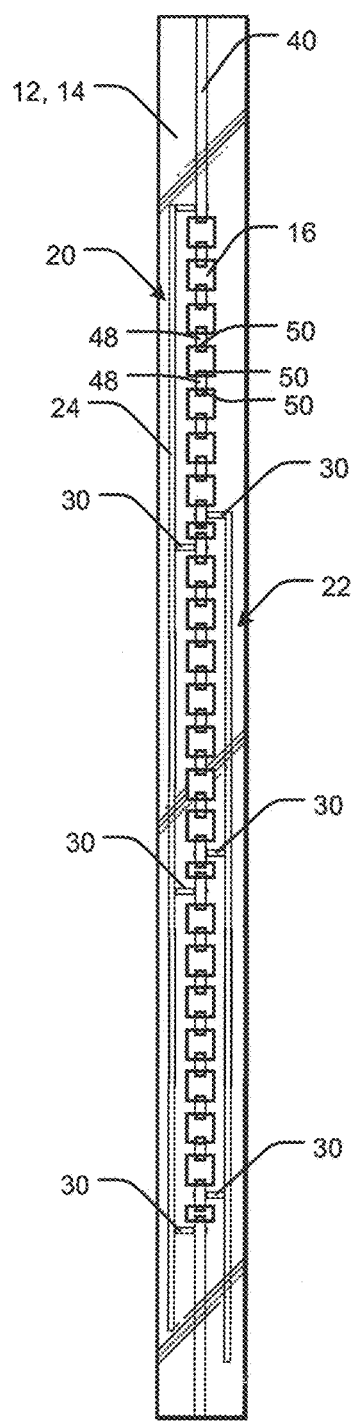
FIG. 8 is a plan view of the lamination of FIG. 7 after perforation of the metallic conductor within the upper laminate sheet perforations.
Figure 9:
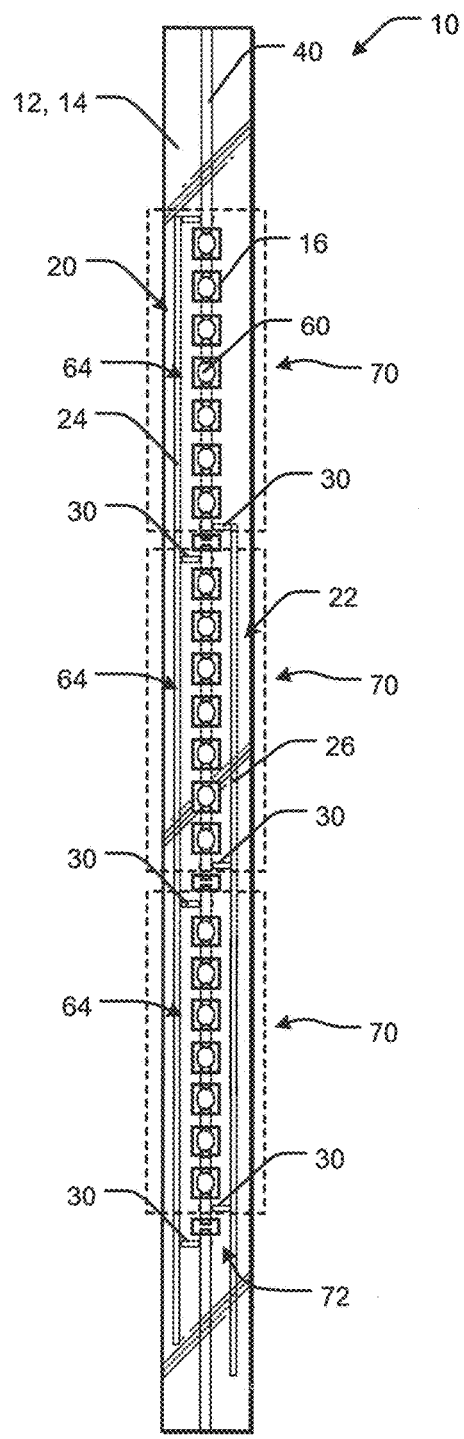
FIG. 9 is a plan view of the lamination of FIG. 8 after addition of light-emitting diodes (LEDs) to form the flexible light engine of according to the present disclosure.

Referring now to FIGS. 1-9, and more particularly FIG. 9, there is shown a flexible light engine 10 according to the present disclosure.

Figure 6:
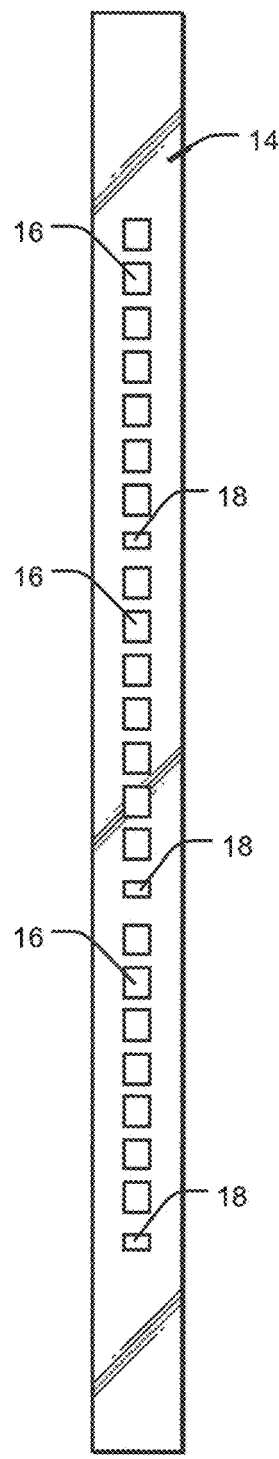
FIG. 6 is a plan view of a perforated upper laminate sheet for the flexible light engine.

Turning to FIGS. 1 and 6, flexible light engine 10 comprises an elongated, electrically insulating, flexible, lower laminate sheet 12 (FIG. 1), as well as an elongated, electrically insulating, flexible, upper laminate sheet 14 (FIG. 6). The lower laminate sheet 12 and the upper laminate sheet 14 may each have a thickness of up to 0.007 inch (0.178 mm). In one exemplary embodiment, the lower laminate sheet 12 and the upper laminate sheet 14 may each be formed of polyethylene terephthalate and may each have a thickness of 0.005 inch (0.127 mm). The lower laminate sheet 12 and the upper laminate sheet 14 may particularly have the same thickness.

The lower laminate sheet 12 and the upper laminate sheet 14 may be formed as an elongated strip of plastic, such as a thermoplastic polyester, which may comprise, essentially consist of, or consist of, at least one of polyethylene terephthalate (PET) and polyethylene napthalate (PEN), preferably white. The lower laminate sheet 12 and the upper laminate sheet 14 may particularly be formed of the same plastic composition.

Lower laminate sheet 12 and upper laminate sheet 14 are coextensive with respect to major longitudinal direction L and width direction W (which is transverse to the major longitudinal direction L). Lower laminate sheet 12 may be obtained from a first roll of sheet material, while upper laminate sheet 14 is obtained from a second roll of sheet material, particularly as part of roll-to-roll manufacturing of a circuit for the flexible light engine 10. In contrast to lower laminate sheet 12, upper laminate sheet 14 includes a plurality of perforations 16, 18 which are arranged in a single row. As explained herein, perforations 16 are to be occupied by light-emitting-diode packages 60. However, perforations 18, which are shown to be smaller than perforations 16 and occur as each eighth perforation, are not so occupied by light-emitting-diode packages 60.

Figure 2:
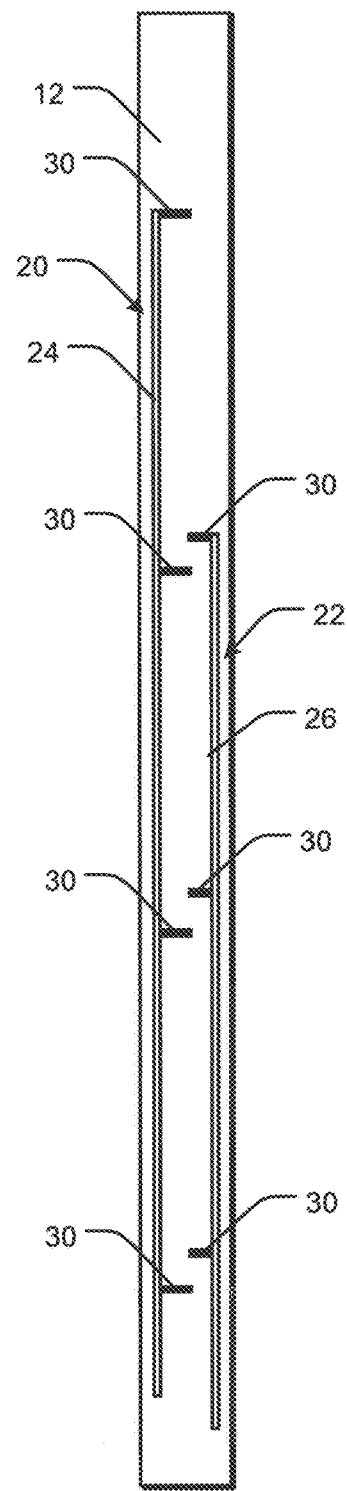
FIG. 2 is a plan view of the lower laminate sheet after first and second bus bars, including interconnectors, are disposed thereon.

Referring to FIG. 2, disposed in a single conductive layer on the lower laminate sheet 12 are a first electrically conductive metallic bus bar 20 and a second electrically conductive metallic bus bar 22, which each comprise an elongated strip 24, 26, respectively, and are formed extending parallel with the longitudinal direction L of the lower laminate sheet 12. First and second bus bars 20, 22 may be particularly formed from a pre-formed/pre-shaped metallic conductor, such as at least one of metallic ribbon, metallic tape, and/or metal wire. The first electrically conductive metallic bus bar 20 and the second electrically conductive metallic bus bar 22 may also be formed in situ by printing or otherwise applying an electrically conductive (organic) ink. It should be understood that a suitable electrically conductive metallic conductor may comprise, essentially consist of, or consist of metal. A preferred conductor of copper, such a copper ribbon, may have a thermal conductivity of about 400 W/m·K as known in the art, through this is not a limiting value.

As also shown in FIG. 2, a plurality of (at least two) electrically conductive interconnectors 30 are arranged at a plurality of spaced locations along the longitudinal direction L of the first and second bus bars 20, 22. As shown, the interconnectors 30 of the first bus bar 20 extend in a direction toward the second bus bar 22, and similarly the interconnectors 30 of the second bus bar 22 extend in a direction toward the first bus bar 20.

Interconnectors 30 may be formed in-situ by printing or otherwise applying an electrically conductive (organic) ink, which may be understood as an ink which contains electrically conductive particles dispersed in a non-conductive liquid (dryable) carrier. Such inks may comprise silver and/or copper particles.

An exemplary electrically conductive ink may be nano-copper conductive ink from Intrinsiq Materials (Farnborough, UK), which may be used in a High Resolution ElectroStatic Ink JET (ESJET) from Precision Varionic International (Swindon, UK).

Another exemplary electrically conductive ink may be a single component, solvent-resistant ink from Creative Materials (Ayer, Mass.), such as product no. 118-09C, which may be understood as silver ink.

Another exemplary electrically conductive ink may be may be a screen printable, thermoplastic polymer, thick film silver ink from Spraylat Corporation Electronic Materials Group (Mt. Vernon, N.Y.), such as product no. XCSD-006.

Figure 3:
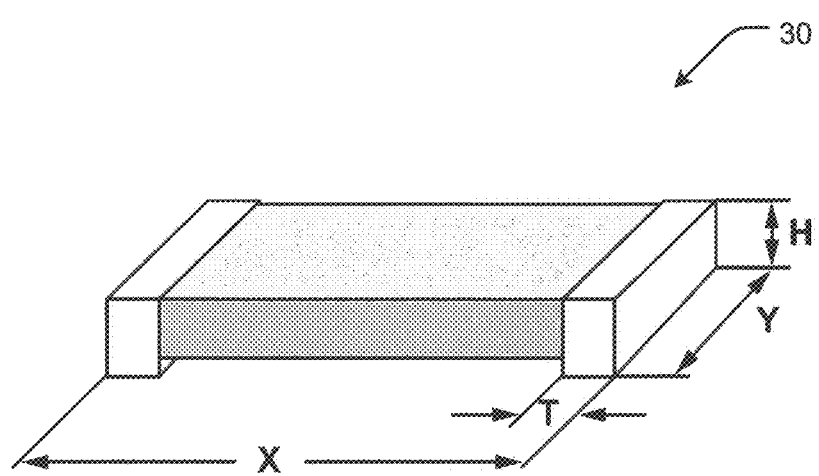
FIG. 3 is a perspective view of a zero-ohm jumper which may be used for an interconnector.

In other embodiments, as shown in FIG. 3, the interconnectors 30 may be formed by surface mounted metallic jumpers, which may be zero-ohm jumpers formed of copper ribbon. For example, the zero-ohm jumper (0.0002 ohm max.) may be a solid copper strip surface mount resistor from Vishay Intertechnology (Malvern, Pa.). The zero-ohm jumpers may have a length X in a range of 0.060 to 0.250 inch (1.52 to 6.35 mm), a width Y of 0.030 to 0.125 inch (0.76 to 3.18 mm), and a height H of 0.013 to 0.025 inch (0.330 to 0.635 mm) and a thickness T of 0.015 to 0.030 inch (0.381 to 0.762 mm).

In certain embodiments, the foregoing construction of a preformed material for the first and second bus bars 20, 22 being used in conjunction with a material formed in-situ for the interconnectors 30 may be understood to provide a "hybrid" construction for the electrical pathways which offers certain advantages. For example, the preformed electrically conductive metallic conductor for the first and second bus bars 20, 22 may provide high thermal conductivity and heat dissipation, while the printed electrically conductive metal particle filled liquid solidified in-situ for the interconnectors 30 may provide low-cost and manufacturing flexibility with regards to formation thereof.

It should be understood that while the first bus bar 20 and second bus bar 22 are shown as being disposed in a single conductive layer on the lower laminate sheet 12, such may be disposed on at least one of the lower laminate sheet 12 and the upper laminate sheet 14.

Figure 4:
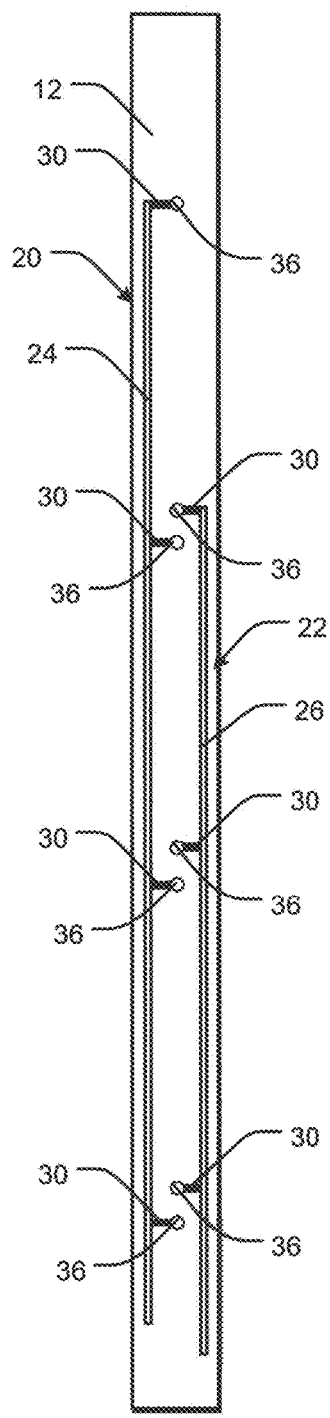
FIG. 4 is a plan view of the lower laminate sheet after an electrically conductive flowable joining composition is disposed thereon, particularly on the interconnectors.

Referring now to FIG. 4, after formation of the first and second bus bars 20, 22, including the interconnectors 30, a bead 36 of an electrically conductive flowable joining composition may be applied at the terminal end of each of the interconnectors 30. In certain embodiments, the bead 36 of flowable joining composition may be formed of an electrically conductive metal filled epoxy, such as a silver filled epoxy. Alternatively, the bead 36 of electrically conductive flowable joining composition may be formed of electrically conductive metal solder, such as bismuth-tin (Bi—Sn) solder.

Figure 5:
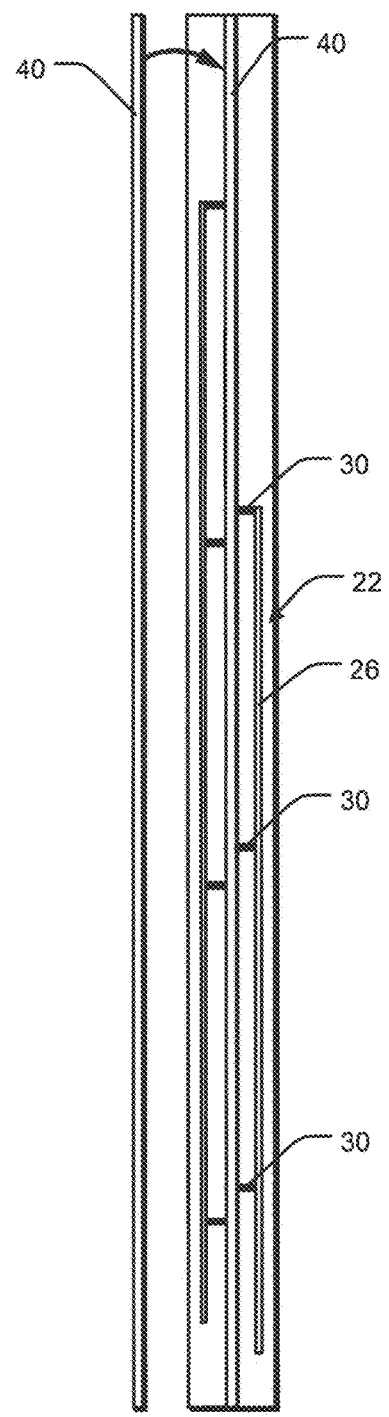
FIG. 5 is a plan view of the lower laminate sheet after an elongated metallic conductor is disposed thereon, particularly over the electrically conductive flowable joining composition and interconnectors.

Thereafter, as shown in FIG. 5, an electrically conductive metallic strip 40, particularly from a third roll, is disposed in the single conductive layer of each of the first and second bus bars 20, 22, particularly at the interconnectors 30. As shown, the metallic strip 40 extends parallel with the longitudinal direction L of the lower laminate sheet 12, and with the first and second bus bars 20, 22. Similar to the first and second bus bars 20, 22, the metallic strip 40 may be particularly formed from a pre-formed/pre-shaped metallic conductor, such as at least one of metallic ribbon, metallic tape, and/or metal wire. It should be understood that a suitable electrically conductive metallic conductor may comprise, essentially consist of, or consist of metal. A preferred conductor of copper, such a copper ribbon, may have a thermal conductivity of about 400 W/m·K as known in the art, through this is not a limiting value.

More particularly, the metallic strip 40 is connected to each of the first and second bus bars 20, 22 via the plurality of spaced locations of the interconnectors 30 of the first and second bus bars 20, 22, particularly with the beads 36 of electrically conductive flowable joining composition applied at the terminal end of each of the interconnectors 30.

Referring now to FIGS. 6 and 7, perforated upper laminate sheet 14 may be disposed over and aligned with lower laminate sheet 12 in the longitudinal direction L, and thereafter laminated with lower laminate sheet 12 such that the metallic strip 40, the first and second bus bars 20, 22 and the interconnectors 30 are retained between the lower laminate sheet 12 and the upper laminate sheet 14.

If the beads 36 of flowable joining composition applied at the terminal end of each of the interconnectors 30 are formed of electrically conductive epoxy, the heat of laminating the lower laminate sheet 12 with the upper laminate sheet 14 may be used to cure the applied electrically conductive epoxy. In such instance, it should be understood that, in applying the electrically conductive epoxy at the terminal end of each of the interconnectors 30, such is positioned between the metallic strip 40 and one of the first and second bus bars 20, 22.

As shown by FIG. 7, the perforations 16, 18 of the upper laminate sheet 14 are in register with portions 42 of the metallic strip 40, such that the metallic strip portions 42 are exposed. Such may be formed with a "registered lamination" process as known in the art. It should be understood that while the manufacturing process has been described above as upper laminate sheet 14 being perforated with perforations 16, 18 before being laminated with lower laminate sheet 12, the perforations 16, 18 in upper laminate sheet 14 may be formed after upper laminate sheet 14 is laminated with lower laminate sheet 12, such as with a laser.

Thereafter, as shown in FIG. 8, the exposed portions 42 of the metallic strip 40 within the perforations 16, 18 in upper laminate sheet 14 are also perforated to remove a medial section of the exposed portion 42, thereby defining a plurality of exposed electrically conductive metallic contacts 50 within each perforation 16, 18.

Furthermore, perforating the exposed portions 42 of the metallic strip 40 defines a plurality of metallic conductors 48, which extend in the longitudinal direction L, with each metallic conductor 48 providing two of the metallic contacts 50 at opposing longitudinal ends thereof, particularly with the metallic conductor 48 extending between adjacent perforations 16 of the upper laminate sheet 14 in between the lower laminate sheet 12 and the upper laminate sheet 14.

In the foregoing manner and with the foregoing arrangement, as shown by FIG. 8, a plurality of electrically conductive metallic conductors 48, as well as the first and second bus bars 20, 22, are disposed in the single conductive layer between the lower laminate sheet 12 and the upper laminate sheet 14.

It should be understood that, with regards to the plurality of electrically conductive metallic conductors 48, as well as the first and second bus bars 20, 22, being disposed in the single conductive layer between the lower laminate sheet 12 and the upper laminate sheet 14, that the single layer is preferably devoid of any intervening layer between it and the lower laminate sheet 12, as well as between it and the upper laminate sheet 14. That is, the plurality of electrically conductive metallic conductors 48, as well as the first and second bus bars 20, 22, are immediately adjacent the lower and upper laminate sheets 12, 14 devoid of any intervening layer. It is understood as resulting in "a single layer" between the lower and upper laminate sheets 12, 14 upon final assembly if, e.g. first bus bar 20 is formed on lower laminate sheet 12, second bus bar 22 is formed on upper laminate sheet 14, or both the first and second bus bars 20, 22 are formed on the same laminate sheet 12 or 14.

Continuing with FIG. 8, the plurality of metallic conductors 48 are disposed laterally, in a width direction W, between the first bus bar 20 and the second bus bar 22. By being disposed between the lower laminate sheet 12 and the upper laminate sheet 14, the metallic conductors 48 are clamped in position extending between adjacent perforations 16 by a compressive force of the lower and upper laminated sheets 12, 14 without a need for an adhesive.

Moreover, as shown, the two metallic contacts 50 of each metallic conductor 48 are exposed in register with adjacent perforations 16 in the perforated upper laminate sheet 14.

As shown in FIG. 9, in each perforation 16 of the upper laminate sheet 14, a surface mount light emitting diode (LED) package 60 is coupled to each of the metallic contacts 50 provided by the exposed portions 42 of the metallic conductors 48. After formation of the flexible light engine 10, it may be then coiled onto a fourth roll.

It should be understood that the methods disclosed herein may operate as a continuous, so-called roll-to-roll process, limited in length by the length of the feedstock polymer film for the lower and upper sheets 12, 14 or metal ribbon for the metallic strip 48, and can typically operate at 300 feet per minute.

With attachment of the LED packages 60, a plurality of parallel LED strings 64 are provided connected in series between the first and second bus bars 20, 22. More particularly, as shown, the metallic conductors 48 are connected to respective interconnectors 30 to define at least two series circuits 70 (in a single row) and connectable in parallel between the first and second bus bars 20, 22, where each of the at least two series circuits 70 comprises a subset of the plurality of metallic conductors 48. As such, the plurality of LEDs 60 attached to the metallic contacts 48 define at least two series LED strings 64 and are connected in parallel between the first and second bus bars 20, 22, with each LED string 64 comprising a plurality of LEDs 60.

As set forth above, use of a preformed material (e.g. copper ribbon) for the first and second bus bars 20, 22 being used in conjunction with a material formed in-situ (e.g. printed conductive ink) for the interconnectors 30 may be understood to provide a "hybrid" construction for the electrical pathways which offers certain advantages. For example, the preformed electrically conductive metallic conductor for the first and second bus bars 20, 22 may provide high thermal conductivity and heat dissipation, while the printed electrically conductive metal particle filled liquid solidified in-situ for the interconnectors 30 may provide low-cost and manufacturing flexibility with regards to formation thereof. Such may be particularly advantageous for LED tube lamps as explained in greater detail below.

Conventional fluorescent tube lamps may be replaced with LED retrofit tube lamps to eliminate the hazardous waste associated with mercury contained within the fluorescent lamps, as well as reduce power consumption. In doing so, a 48-inch LED retrofit tube lamp (e.g. T8, T10, T12), for example, may utilize a strip of LEDs wired in series in a single row within the lamp.

By way of example, consider a 2 foot long (61 cm) circuit on PET having 24 LEDs connected in series. With use of a metallic strip 40 of copper ribbon, it may be expected that the voltage drop across the circuit would be about 72 volts (3 volts per LED). Due to the high thermal conductivity and heat dissipation of the copper ribbon metallic strip, the output for the 24 LEDs may be expected to be about 450 lumens, with a junction temperature for each LED of only about 50° C. at 50 mA. It is known that maintaining a junction temperature at or below 50° C. is important for maintaining lifetime of typical mid-power LEDs.

While use of copper ribbon provides high thermal conductivity and heat dissipation, use of copper ribbon is also relatively expensive. Alternatively, to reduce cost, as well as increase manufacturing flexibility, the metallic strip 40 may be printed using an electrically conductive ink. However, with such a construction, the junction temperature may be expected to rise to 80° C. at 50 mA due to the lower thermal conductivity of the printed ink metallic strip as compared to the copper ribbon, which will reduce the lifetime of the LEDs, as well as lower output efficiency to about 420 lumens.

However, by making use of a "hybrid" structure of (1) copper ribbon for the first and second bus bars 20, 22 and the metallic strip 40; together with (2) printed conductive metallic ink for the interconnectors 30, particularly in combination with a plurality of series LED strings 64 connected in parallel, a balance of thermal conduction, heat dissipation, manufacturing flexibility, manufacturing cost and lighting performance may be achieved, particularly including maintaining junction temperatures at or below 50° C. at 50 mA and providing high lighting efficiency. In part, such may be achieved by forming three strings (of eight series LEDs in each string) in parallel, the voltage is reduced to 24 volts.

While a preferred embodiment of the present disclosure has been described, it should be understood that various changes, adaptations and modifications can be made therein without departing from the spirit of the disclosure and the scope of the appended claims. The scope of the disclosure should, therefore, be determined not with reference to the above description, but instead should be determined with reference to the appended claims along with their full scope of equivalents. Furthermore, it should be understood that the appended claims do not necessarily comprise the broadest scope of the disclosure which the applicant is entitled to claim, or the only manner in which the disclosure may be claimed, or that all recited features are necessary.

LISTING OF REFERENCE CHARACTERS

10 flexible light engine
12 lower laminate sheet
14 upper laminate sheet
16 perforations
20 first bus bar
22 second bus bar
24 first bus bar elongated strip
26 second bus bar elongated strip
30 interconnectors
36 electrically conductive joining composition
40 metallic strip
42 exposed portions of metallic strip
48 metallic conductors
50 metallic contacts
60 LED package
64 LED string
70 series circuits
72 single row
L length direction of flexible light engine
W width direction of flexible light engine

We claim:
1. A method of roll-to-roll manufacturing a circuit for a flexible light engine (10), comprising:
providing an electrically insulating, flexible lower laminate sheet (12) from a first roll;
providing an electrically insulating, flexible upper laminate sheet (14) from a second roll;
forming electrically conductive first and second metallic bus bars (20, 22) in a single conductive layer on at least one of the lower and upper laminate sheets (12, 14);
forming electrically conductive interconnectors (30) at a plurality of locations on each of the first and second metallic bus bars (20, 22);
providing a metallic strip (40) from a third roll;
disposing the metallic strip (40) in the single conductive layer on at least one of the lower and upper laminate sheets (12, 14);
connecting the metallic strip (40) via the interconnectors (30) to the first metallic bus bar (20) at the plurality of interconnector locations of the first metallic bus bar (20);

connecting the metallic strip (40) via the interconnectors (30) to the second metallic bus bar (22) at the plurality of electrical interconnector locations of the second metallic bus bar (22);

retaining the metallic strip (40) between the lower laminate sheet (12) and the upper laminate sheet (14) by laminating the lower laminate sheet (12) with the upper laminate sheet (14), whereby the laminating also disposes the first and second metallic bus bars (20, 22) between the lower laminate sheet (12) and the upper laminate sheet (14);

perforating the upper laminate sheet (14), wherein perforations (16) of the upper laminate sheet (14) are in register with exposed portions (42) of the metallic strip (40);

perforating the exposed portions (42) of the metallic strip (40) thereby defining a plurality of metallic contacts (50);

coupling an LED package (60) within each perforation (16) of the upper laminate sheet (14) to the metallic contacts (50) provided by the exposed portions (42) of the metallic strip (40), thereby defining a plurality of series LED strings (64) connected in parallel between the first and second metallic bus bars (20, 22); and coiling the flexible light engine (10) onto a fourth roll.

2. The method of claim 1, wherein:
perforating the exposed portions (42) of the metallic strip (40) defines a plurality of metallic conductors (48) each having two respective of the metallic contacts (50), each metallic conductor (48) extending between adjacent perforations (16) of the upper laminate sheet (14).

3. The method of claim 1, further comprising:
aligning the lower and upper laminate sheets (12, 14) in a major longitudinal direction (L);
wherein the first and second metallic bus bars (20, 22) are formed extending in the major longitudinal direction (L); and
wherein the metallic strip (40) is disposed extending in the major longitudinal direction (L).

4. The method of claim 1, wherein:
forming the interconnectors (30) comprises printing an electrically conductive ink.

5. The method of claim 1, wherein:
forming the interconnectors (30) comprises surface mounting zero-Ohm jumpers.

6. The method of claim 1, further comprising:
applying an electrically conductive epoxy (36) between the metallic strip (40) and one of the first and second metallic bus bars (20, 22); and
wherein the laminating the lower laminate sheet (12) with the upper laminate sheet (14) cures the applied conductive epoxy (36).

7. The method of claim 1, wherein the perforating comprises severing.

8. The method of claim 7, wherein the severing is performed mechanically.

9. The method of claim 7, wherein the severing is performed by a laser.

10. The method of claim 1, wherein the retaining the metallic strip (40) between the lower laminate sheet (12) and the upper laminate sheet (14) in the single conductive layer comprises retaining in direct contacting relation with the lower and upper laminate sheets (12, 14) devoid of an adhesive layer.

11. A flexible light engine (10), comprising:
an electrically insulating, flexible lower laminate sheet (12);
an electrically insulating, perforated, flexible upper laminate sheet (14);
a first metallic bus bar (20) and a second metallic bus bar (22) disposed in a single conductive layer between the lower laminate sheet (12) and the upper laminate sheet (14), the first metallic bus bar (20) and the second metallic bus bar (22) being electrically conductive;
a plurality of electrically conductive metallic conductors (48) being disposed in the single conductive layer between the lower laminate sheet (12) and the upper laminate sheet (14) and being disposed laterally, in a width direction (W), between the first metallic bus bar (20) and the second metallic bus bar (22);
wherein each metallic conductor (48) defines two metallic contacts (50), one said metallic contact (50) being at each opposing free end of each said metallic conductor (48), and each metallic conductor (48) extends between adjacent perforations (16) in the perforated upper laminate sheet (14), the two metallic contacts (50) of each metallic conductor (48) being exposed in register with adjacent perforations (16) in the perforated upper laminate sheet (14);
wherein each of the first and second metallic bus bars (20, 22) further comprises respective at least two interconnectors (30), and wherein the metallic conductors (48) are connected to respective interconnectors (30) to define at least two series circuits (70) and connectable in parallel between the first and second metallic bus bars (20, 22), wherein each of the at least two series circuits (70) comprises a subset of the plurality of metallic conductors (48); and
a plurality of surface mount light emitting diodes (LEDs) (60) attached to the metallic contacts (50) defining at least two series LED strings (64) and connected in parallel between the first and second metallic bus bars (20, 22), each said LED string (64) comprising a plurality of LEDs (60).

12. The flexible light engine (10) of claim 11, wherein:
the lower laminate sheet (12) and the upper laminate sheet (14) comprise at least one of polyethylene terephthalate (PET) and polyethylene napthalate (PEN).

13. The flexible light engine (10) of claim 11, wherein:
the lower laminate sheet (12) and the upper laminate sheet (14) consist of at least one of polyethylene terephthalate (PET) and polyethylene napthalate (PEN).

14. The flexible light engine (10) of claim 11, wherein:
the at least two interconnectors (30) of each of the first and second metallic bus bars (20, 22) are printed from electrically conductive ink containing metal particles.

15. The flexible light engine (10) of claim 11, wherein:
the first and second metallic bus bars (20, 22) comprise at least one of a metallic ribbon, a metallic tape, and/or a metal wire.

16. The flexible light engine (10) of claim 11, wherein:
the interconnectors (30) comprise surface mounted jumpers.

17. The flexible light engine (10) of claim 11, wherein:
the interconnectors (30) comprise zero-Ohm jumpers.

18. The flexible light engine (10) of claim 11, wherein:
the lower laminate sheet (12) and the upper laminate sheet (14) are each formed as a strip extending along a primary major longitudinal direction (L); and
wherein the first and second metallic bus bars (20, 22) and the plurality of metallic conductors (48) extend in the longitudinal direction (L).

19. The flexible light engine (10) of claim 11, wherein:
the at least two series circuits (70) are disposed in a single row (72).

20. The flexible light engine (10) of claim 11, wherein:
the metallic conductors (48) are clamped in position extending between adjacent perforations (16) by a compressive force of the lower and upper laminated sheets (12, 14) without a need for an adhesive.

21. The flexible light engine (10) of claim 11, wherein:
the interconnectors (30) of one of the first and second metallic bus bars (20, 22) extend in a direction toward the other of the first and second metallic bus bars (20, 22).

22. The flexible light engine (10) of claim 11, wherein:
an electrically conductive flowable joining composition adheres at least one of the metallic conductors (48) to one of the interconnectors (30).

23. The flexible light engine (10) of claim 22, wherein:
the electrically conductive flowable joining composition comprises an electrically conductive epoxy or solder.

24. The flexible light engine (10) of claim 22, wherein:
the lower laminate sheet (12) and the upper laminate sheet (14) each have a thickness of up to 0.007 inch.

25. The flexible light engine (10) of claim 14, wherein:
the first and second metallic bus bars (20, 22) and the metallic conductors (48) comprise at least one of a metallic ribbon, a metallic tape, and/or a metal wire.

\* \* \* \* \*